United States Patent
Jiang

(10) Patent No.: US 11,611,173 B2
(45) Date of Patent: Mar. 21, 2023

(54) MOUNTING SEAT FOR ELECTRONIC DEVICE AND ELECTRONIC APPARATUS

(71) Applicants: K-Tronics (Suzhou) Technology Co., Ltd., Jiangsu (CN); BOE Technology Group Co., Ltd., Beijing (CN)

(72) Inventor: Jiahong Jiang, Beijing (CN)

(73) Assignees: K-TRONICS (SUZHOU) TECHNOLOGY CO., LTD., Jiangsu (CN); BOE TECHNOLOGY GROUP CO., LTD., Beijing (CN)

( * ) Notice: Subject to any disclaimer, the term of this patent is extended or adjusted under 35 U.S.C. 154(b) by 504 days.

(21) Appl. No.: 16/344,387

(22) PCT Filed: Sep. 7, 2018

(86) PCT No.: PCT/CN2018/104649
§ 371 (c)(1),
(2) Date: Apr. 24, 2019

(87) PCT Pub. No.: WO2019/134386
PCT Pub. Date: Jul. 11, 2019

(65) Prior Publication Data
US 2021/0336379 A1    Oct. 28, 2021

(30) Foreign Application Priority Data
Jan. 8, 2018   (CN) .......................... 201820025346.0

(51) Int. Cl.
*H01R 13/56*    (2006.01)
*B23K 37/04*    (2006.01)
(Continued)

(52) U.S. Cl.
CPC ............. *H01R 13/56* (2013.01); *B23K 37/04* (2013.01); *H01R 4/02* (2013.01); *H01R 13/5825* (2013.01)

(58) Field of Classification Search
None
See application file for complete search history.

(56) References Cited

U.S. PATENT DOCUMENTS 3,126,184 A * 3/1964 Kropp ..................... F16L 3/127
248/73
3,363,864 A * 1/1968 Olgreen ................... F16L 3/04
248/68.1
(Continued)

FOREIGN PATENT DOCUMENTS

CN    202308580 U    7/2012
CN    202352863 U    7/2012
(Continued)

OTHER PUBLICATIONS

International Search Report (including English translation) and Written Opinion of PCT/CN2018/104649, dated Jan. 8, 2018.
(Continued)

*Primary Examiner* — Ross N Gushi
(74) *Attorney, Agent, or Firm* — Fay Sharpe LLP

(57) ABSTRACT

The present disclosure discloses a mounting seat for an electronic device and an electronic apparatus. The mounting seat mounting seat for an electronic device, comprising a seat body and at least one wire limiting structure, a mounting region for mounting a wire weld portion of the electronic device is on the seat body, the wire limiting structure is on the seat body near the mounting region, and a limiting passage is on the mounting seat, wherein the limiting passage is at one of the following positions: a position between the wire limiting structure and the seat body; and a position on the wire limiting structure.

4 Claims, 19 Drawing Sheets

(51) Int. Cl.
    *H01R 4/02*      (2006.01)
    *H01R 13/58*     (2006.01)

(56) References Cited

U.S. PATENT DOCUMENTS

| | | | |
|---|---|---|---|
| 3,894,706 A * | 7/1975 | Mizusawa | F16L 3/2235 |
| | | | 248/68.1 |
| 7,226,316 B2 | 6/2007 | Wu | |
| 8,007,321 B1 * | 8/2011 | Chi | H01R 13/72 |
| | | | 439/527 |
| 2014/0360774 A1 | 12/2014 | Suzuki | |
| 2015/0362096 A1 * | 12/2015 | Durney | H05K 7/12 |
| | | | 24/122.3 |
| 2016/0294072 A1 * | 10/2016 | Trafton | H01B 7/02 |
| 2017/0318367 A1 * | 11/2017 | Zhang | H04R 7/127 |

FOREIGN PATENT DOCUMENTS

| | | |
|---|---|---|
| CN | 203193205 U | 9/2013 |
| CN | 204538589 U | 8/2015 |
| CN | 204858454 U | 12/2015 |
| CN | 105896444 A | 8/2016 |
| CN | 205610109 U | 9/2016 |
| EP | 0584683 A1 | 3/1994 |
| JP | S61188204 U | 11/1986 |

OTHER PUBLICATIONS

Extended European search report of counterpart EP application No. 18865354.7 dated Sep. 7, 2021.

* cited by examiner

MOUNTING SEAT FOR ELECTRONIC DEVICE AND ELECTRONIC APPARATUS

CROSS-REFERENCE TO RELATED APPLICATION

This application is a 371 of PCT Patent Application Serial No. PCT/CN2018/104649, filed on Sep. 7, 2018, which claims priority to Chinese Patent Application No. 201820025346.0, filed on Jan. 8, 2018 and entitled "MOUNTING SEAT FOR ELECTRONIC DEVICE AND ELECTRONIC APPARATUS", the entire contents of which are incorporated herein by reference.

TECHNICAL FIELD

The present disclosure relates to a mounting seat for an electronic device and an electronic apparatus.

BACKGROUND

Tin soldering is a welding method, in which low-melting-point solder is heated and melted and then permeates into and fills a gap at a joint of metal pieces. The tin soldering is widely used in the welding of circuits of various electronic devices. For example, when electronic devices such as loudspeakers and circuit boards are connected by wires, welding is usually performed by tin soldering.

After a wire is welded to an electronic device, the wire will often be bent repeatedly in the subsequent technological process or use process. Since the solder is hard and brittle after solidification, if bending occurs at a weld position, it is very likely that the solder falls off or the wire is broken during the bending process of the wire, thereby affecting the normal operation of the electronic device.

SUMMARY OF THE INVENTION

The present disclosure provides, in embodiments of the present disclosure, a mounting seat for an electronic device and an electronic apparatus.

In an aspect, there is provided a mounting seat for an electronic device, comprising a seat body and at least one wire limiting structure, a mounting region for mounting a wire weld portion of the electronic device is on the seat body, the wire limiting structure is on the seat body near the mounting region, and a limiting passage is on the mounting seat, wherein the limiting passage is at one of the following positions:

a position on the wire limiting structure; and a position between the wire limiting structure and the seat body.

In another aspect, there is provided an electronic apparatus, comprising a mounting seat, an electronic device and a wire welded to the electronic device, the mounting seat comprising a seat body and at least one wire limiting structure, a mounting region for mounting a wire weld portion of the electronic device is on the seat body, the wire limiting structure is on the seat body near the mounting region; the electronic device is on the seat body, the wire is on the wire limiting structure in a limited manner; a limiting passage is on the mounting seat, wherein the limiting passage is at one of the following positions:

a position on the wire limiting structure; and a position between the wire limiting structure and the seat body.

DETAILED DESCRIPTION

Figure 1:
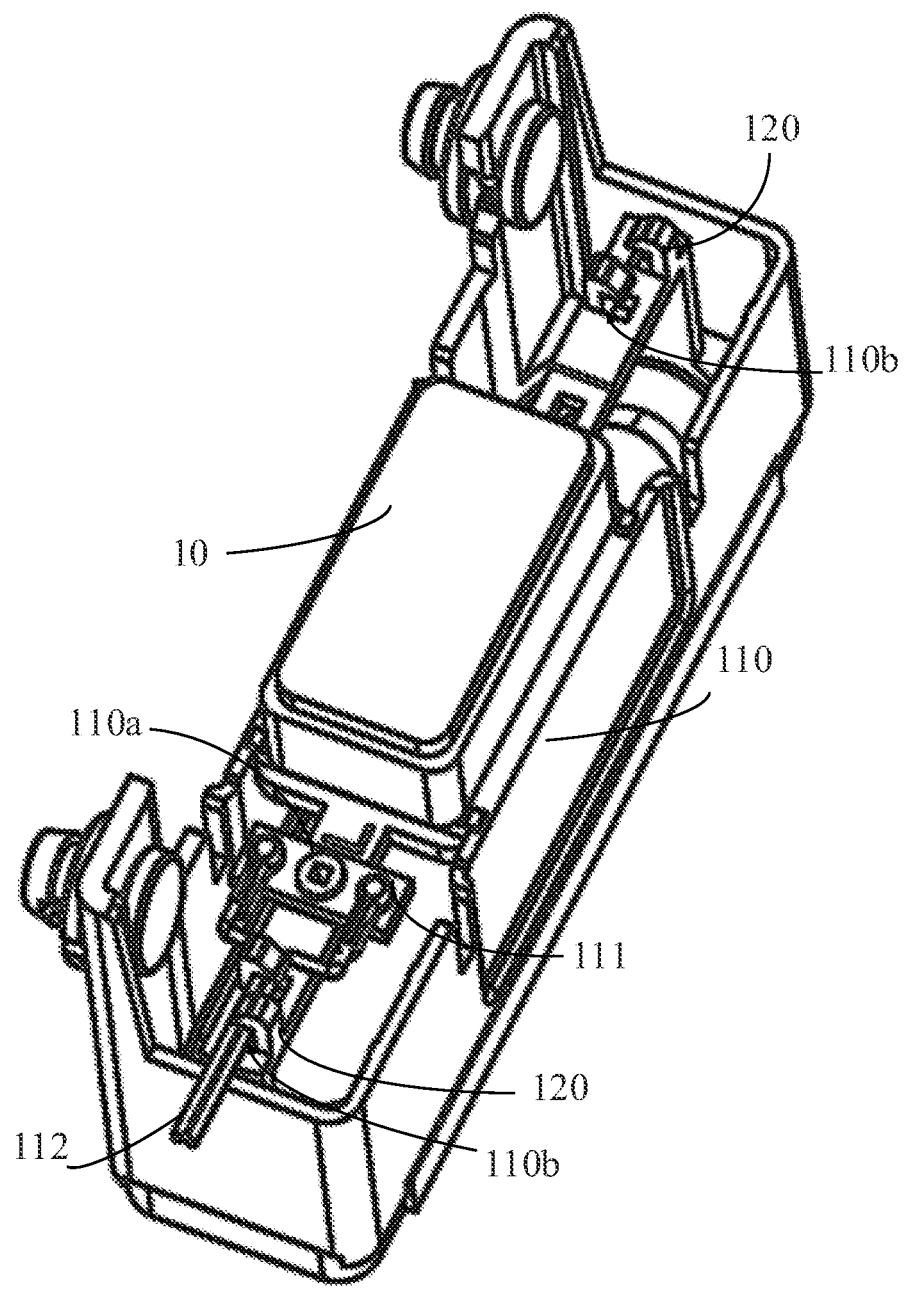
FIG. 1 is a structural diagram of a mounting seat for an electronic device according to an embodiment of the present disclosure.
Figure 18:
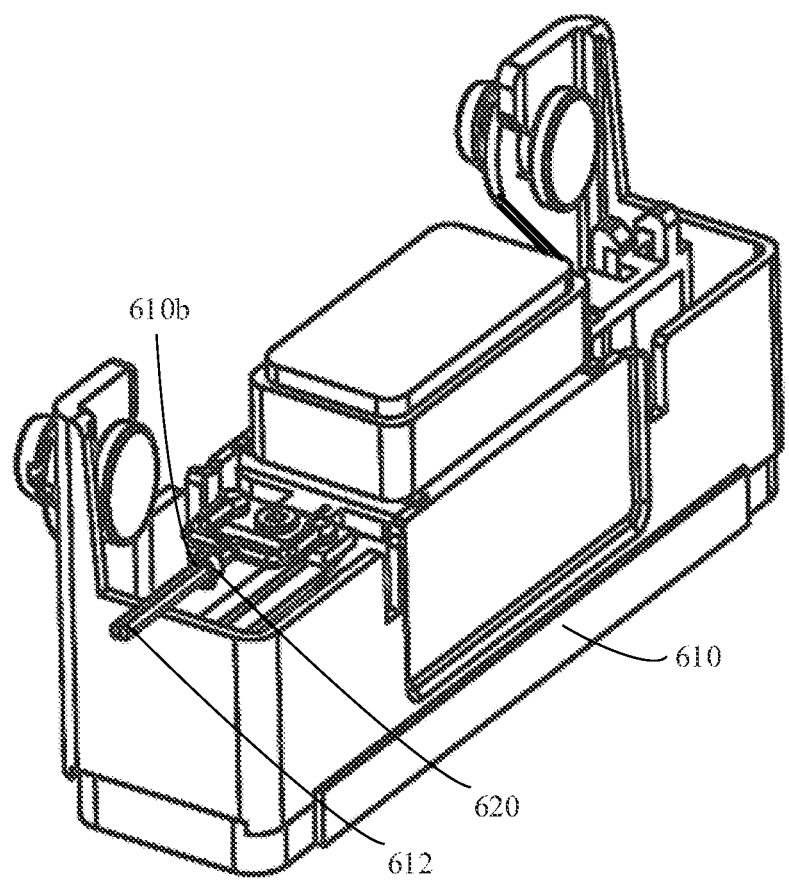
FIG. 18 is a schematic structural diagram of a mounting seat for an electronic device according to an embodiment of the present disclosure.

The present disclosure will be described in further detail with reference to the accompanying drawings, to clearly present principles and advantages of the present disclosure Embodiments of the present disclosure provide a mounting seat for an electronic device. The mounting seat includes a seat body and at least one wire limiting structure. A mounting region for mounting a wire weld portion of the electronic device is provided on the seat body. The wire limiting structure is arranged on the seat body near the mounting region. A limiting passage is provided between the wire limiting structure and the seat body (e.g., as shown in FIG. 1), or a limiting passage is provided on the wire limiting structure (e.g., as shown in FIG. 18).

After a wire is welded to the electronic device, the wire will often be bent repeatedly in the subsequent technological process or use process, so that the wire is easy to break at a weld position. In the embodiments of the present disclosure, by providing the wire limiting structure on the seat body, the wire connected to the electronic device can be limited. When the wire is bent due to an external force, by virtue of the wire limiting structure, the wire will be bent at the wire limiting structure rather than at a weld position, so that the disconnection of the wire from the electronic device at the weld position can be avoided.

The seat body of the mounting seat is a housing for mounting the electronic device. The seat body may be an integrally formed structure or may be structures connected to each other by connectors such as bolts. In addition, the seat body and the wire weld portion of the electronic device may also be of an integrated structure.

The present disclosure will be illustrated in an embodiment by taking a loudspeaker as the electronic device. Of course, in other embodiments, the electronic device may also be other devices, such as a microphone, an electric motor or the like.

FIG. 1 is a structural diagram of a mounting seat for an electronic device according to an embodiment of the present disclosure. As shown in FIG. 1, the mounting seat includes a seat body 110 and four wire limiting structures 120. A mounting region 110a for mounting a wire weld portion 111 of the electronic device is provided on the seat body 110. The wire limiting structures 120 are arranged on the seat body 110 near the mounting region 110a. Limiting passages 110b are provided between the wire limiting structures 120 and the seat body 110.

The seat body shown in FIG. 1 is a housing used for mounting the loudspeaker. For convenience of description, FIG. 1 shows a sounding portion 10 and a printed circuit board for welding wires (e.g., the wire weld portion 111 shown in FIG. 1) of the loudspeaker. The seat body shown in FIG. 1 is of a cuboid shape. In other embodiments, the seat body may also be provided in other shapes, such as a cylindrical shape, a triangular prism shape or the like, and the present disclosure is not limited thereto.

Figure 2:
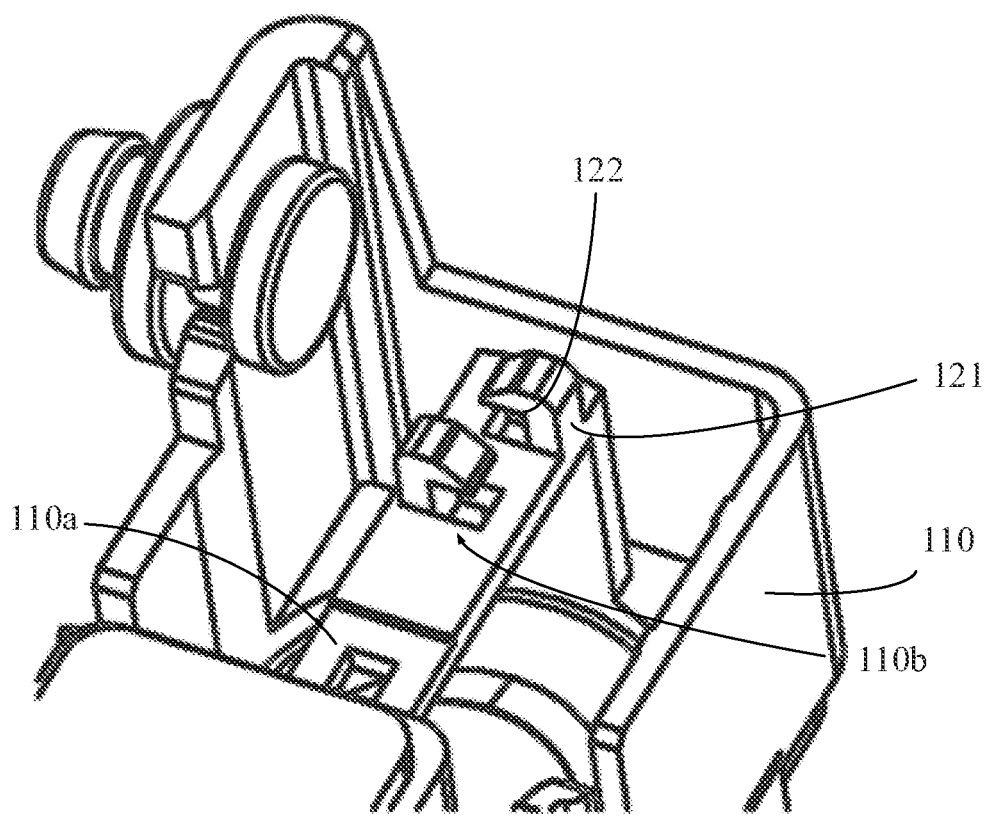
FIG. 2 is a partially enlarged schematic diagram of FIG. 1.

FIG. 2 is a partially enlarged schematic diagram of FIG. 1. As shown in FIG. 2, each of the wire limiting structures 120 includes a connection portion 121 and a stop portion 122. The connection portion 121 is connected between the seat body 110 and the stop portion 122, and the limiting passage 110b is provided between the stop portion 122 and the seat body 110.

As shown in FIG. 2, the connection portion 121 is a bump protruded from a surface of the seat body 110. An extension direction of the bump may be perpendicular to the surface of the seat body 110. The stop portion 122 is a stopper connected to one end of the bump away from the surface of the seat body 110. The stopper, the bump and the surface of the seat body 110 define a slot structure (i.e., a limiting passage 110b), so that a wire 112 may be limited between the stop portion 122 and the seat body (as shown in FIG. 1).

Referring to FIG. 1, when the wire 112 is subjected to an external force, the wire 112 will be bent at the wire limiting structures 120, and the wire 112 located between the wire limiting structures 120 and the mounting region 110a will not be bent, so that the wire is difficult to break at a weld position. The limiting passages 110b are groove structures defined by the stoppers, the bumps and the surface of the seat body 110 rather than closed frame structures. Thus, the limiting passages may be conveniently manufactured by a mold.

Exemplarily, two wires are limited within the limiting passages 110b shown in FIG. 1. In other embodiments, it is also possible that only one wire is mounted; or, by increasing the sectional area of the limiting passages 110b, more wires may be accommodated within the limiting passages 110b.

As shown in FIG. 1, two pairs of wire limiting structures 120 are provided on the seat body 110 (in FIG. 1, two wire limiting structures 120 at the upper right form one pair, and two wire limiting structures 120 at the lower left form the other pair), and the respective stop portions 122 of two wire limiting structures 120 in each pair of wire limiting structures 120 extend in opposite directions. Since the limiting passages 110b are groove structures defined by the stoppers, the bumps and the surface of the seat body 110 rather than closed frame structures, the wires 112 can still fall off from one side of the wire limiting structures 120. Therefore, two wire limiting structures 120 in one pair of wire limiting structures 120 are arranged on two sides of the same wire or the same bundle of wires 112, and the stop portions 122 of the two wire limiting structures 120 are caused to extend in opposite directions. Consequently, the limiting effect on the wires 112 can be improved, and the wires 112 can be prevented from coming out from the limiting passages 110b.

The limiting passages 110b of two wire limiting structures 120 in the same pair of wire limiting structures 120 may extend along the same straight direction. The wires 112 are generally to be connected to other elements (e.g., a power supply or the like) along a short path By such an arrangement, the wire limiting structures 120 may facilitate the arrangement of the wires 112 along a straight line, allowing the wires 112 to be connected to other elements after extending to an edge of the seat body 110 along a short path.

Optionally, two wire limiting structures 120 in the same pair of wire limiting structures 120 may also be located on the same side of the wires, and the stop portions 122 of the two wire lead limiting structures 120 extend in the same direction. In this way, it is more convenient to clamp the wires into the plurality of limiting passages 110b.

In other embodiments, it is also possible to provide a larger number of wire limiting structures 120, for example, 3 pairs of wire limiting structures 120 or 4 pairs of wire limiting structures 120. In addition to being provided in pairs, the wire limiting structures 120 may also be provided separately. For example, only one wire limiting structure 120 is provide on the seat body 110. Or, a plurality of wire limiting structures 120 are provided on the seat body 110, and each wire limiting structure 120 is arranged at a different position on the seat body 110 to limit a respective wire. In addition, it is also possible to make a larger number of limiting passages 110b extend along the same straight direction to facilitate the arrangement of the wires 112, and the present disclosure is not limited thereto.

Optionally, the position of the wire limiting structures 120 may be set according to the wiring requirements. For example, if the wires 112 need to be bent and extended on the surface of the seat body 110, the plurality of wire limiting structures 120 may be arranged along a designed wiring trace.

Although two wire limiting structures 120 in the same pair of wire limiting structures 120 are arranged spaced apart in the extension direction of the wire 112 in FIGS. 1 and 2, in other embodiments, two wire limiting structures 120 in the same pair of wire limiting structures 120 may also be arranged side by side on two sides of the wire to improve the limiting effect on the wire.

In the mounting seat shown in FIG. 1, there are totally two pairs of (i.e., four) wire limiting structures 120, but only two wire limiting structures 120 are used. In other embodiments, it is also possible to use three wire limiting structures 140 or four wire limiting structures 120. During mounting of an electronic device, not all of the wire limiting structures 120 on the mounting seat are used, and it is possible to select, according to the position of the wires to be set, wire limiting structures 120 at suitable positions on the mounting seat to limit the wires.

Figure 3:
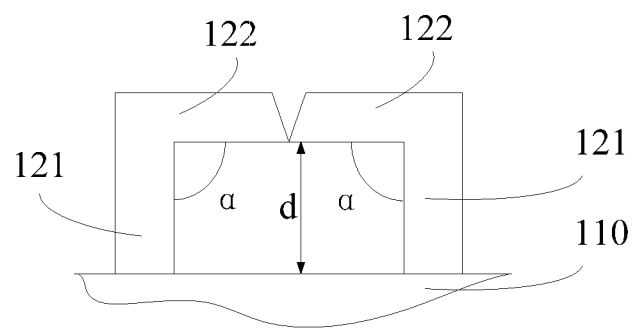
FIG. 3 is a partial schematic structural diagram of a mounting seat for an electronic device according an embodiment of the present disclosure.

FIG. 3 is a partially schematic structural diagram of a mounting seat for an electronic device according to an embodiment of the present disclosure. As shown in FIG. 3, the respective stop portions 122 of two wire limiting structures 120 in each pair of wire limiting structures 120 may extend toward each other and be connected to each other. In this way, a closed passage is formed between the two wire limiting structures 120, so that the limiting effect on the wire can be further improved.

Optionally, an included angle α formed at a junction of the connection portion 121 with the stop portion 122 may be set to not exceed 90°. In this way, the wire is less likely to fall off from the limiting passage 110b after being clamped into the limiting passage 110b. Although the wire limiting structure shown in FIG. 3 is taken as example here, in other wire limiting structures, for example, in the wire limiting structures shown in FIGS. 1 and 2, the included angle α formed at the junction of the bump (e.g., the connection portion 121) with the stopper (e.g., the stop portion 122) may also be set to not exceed 90°.

Further, the width value at a position where the width d of the limiting passage 110b is minimal may be slightly smaller than the diameter of the wire 112. Since the wire 112 is generally covered with an insulating skin which has a certain elasticity, the wire 112 can still be clamped into the limiting passage 110b, which is advantageous in preventing the wire 112 from coming out from the limiting passage 110b.

Optionally, the stop portion 122 and the connection portion 121 may be connected elastically. By prodding the stop portion 122 to bend the stop portion 122 relative to the connection portion 121, the wire 112 can be easily placed into the limiting passage 110b or taken out from the limiting passage 110b.

Exemplarily, it is possible that the stop portion 122 and the connection portion 121 are connected by an elastic rubber, or the stop portion 122 is directly made of elastic rubber, or the wire limiting structure 120 is made of elastic rubber.

Optionally, the stop portion 122 and the connection portion 121 may also be connected detachably. By adopting the detachable connection mode, is possible to separate the stop portion 122 from the connection portion 121 when a wire needs to be arranged or removed, and then mount the stop portion 122 to the connection portion 121 after the wire is arranged in the limiting passage 110b or removed from the limiting passage 110b.

Figure 4:
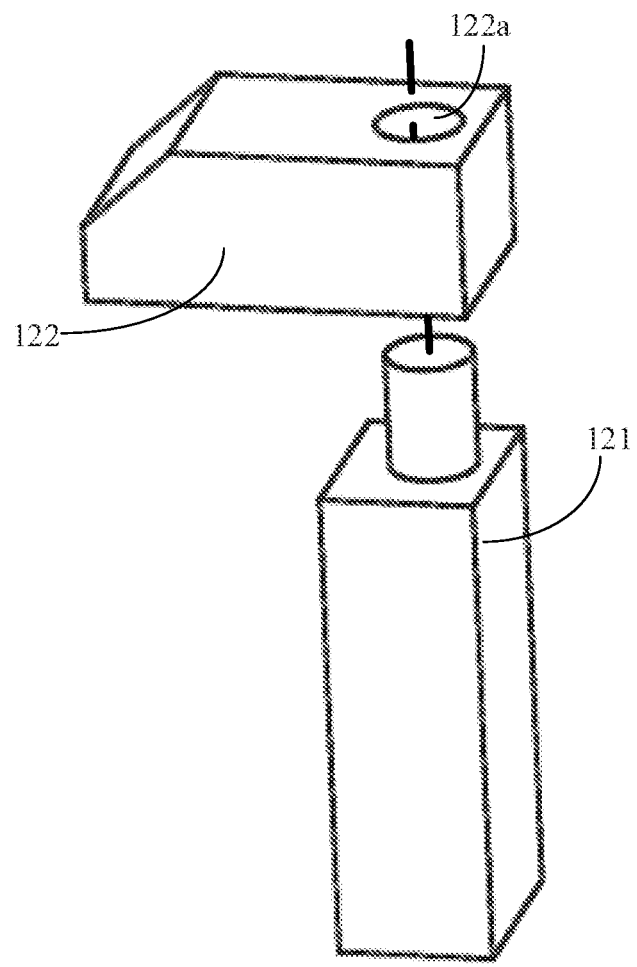
FIG. 4 is a schematic assembly diagram of a stop portion and a connection portion according to an embodiment of the present disclosure.

FIG. 4 is a schematic assembly diagram of the stop portion and the connection portion according to an embodiment of the present disclosure. As shown FIG. 4, a connecting hole 122a may be formed in the stop portion 122, and the stop portion 122 is clamped to the connection portion 121 through the connecting hole 122a. The structure shown in FIG. 4 is merely illustrative, and in some embodiment, it is also possible to provide other detachable structures for connecting the stop portion 122 and the connection portion 121. For example, it is also possible to mount the stop portion 122 to the connection portion 121 by a screw or to adhere the stop portion 122 to the connection portion 121 by an adhesive.

Figure 5:
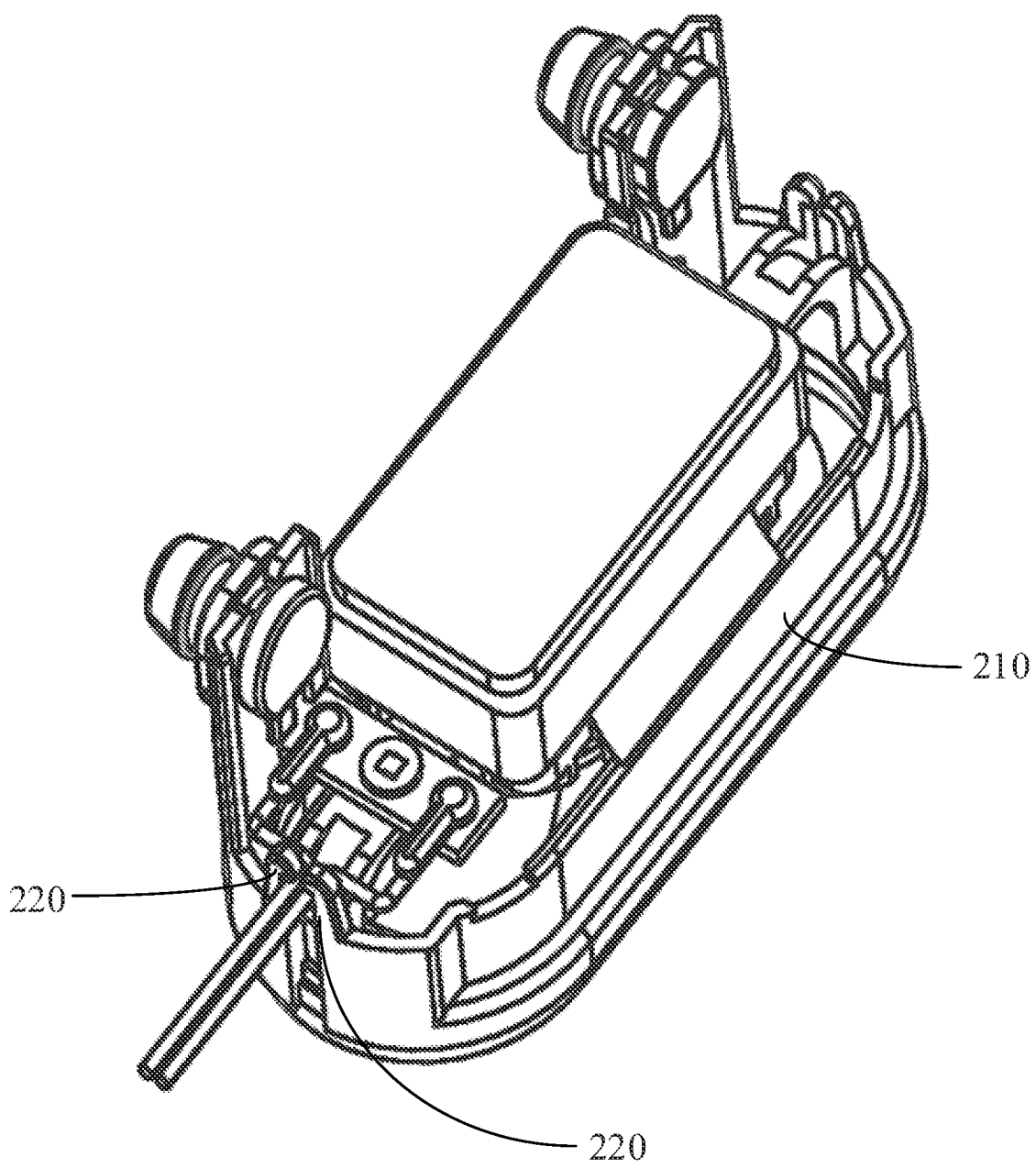
FIG. 5 is a schematic structural diagram of a mounting seat for an electronic device according to an embodiment of the present disclosure.

FIG. 5 is a schematic structural diagram of a mounting seat for an electronic device according to an embodiment of the present embodiment. A pair of wire limiting structures 220 is provided on a seat body 210 of the mounting seat. As shown in FIG. 5, the two wire limiting structures 220 are arranged on an edge of the seat body 210, i.e., on a sidewall of the seat body 210. The seat body 210 of the mounting seat for the electronic device is generally a thin housing structure. By arranging the wire limiting structures 220 on the edge of the seat body 210, it may be convenient to integrally form the wire limiting structures 220 and the seat body 210.

Figure 6:
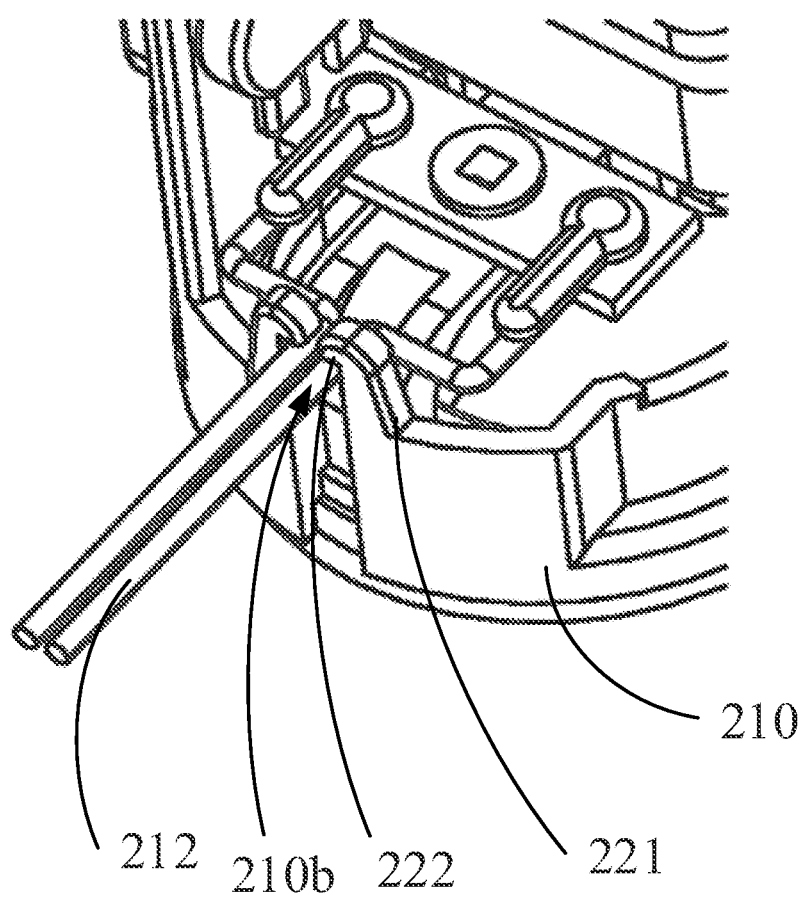
FIG. 6 is a partially enlarged schematic diagram of FIG. 5.

FIG. 6 is a partially enlarged schematic diagram of FIG. 5. As shown in FIG. 6, the respective stop portions 222 of the two wire limiting structures 220 extend toward each other, so that a limiting passage 210b is formed between the two wire limiting structures 220. Connection portions 221 of the two wire limiting structures 220 limit two sides of a wire 212, respectively, and the stop portions 222 of the two wire limiting structures 220 limit the wire 212 within the limiting passage 220b, so that the wire 21 can be bent only at the two wire limiting structures 220.

Further, it is also possible that the respective stop portions 222 of the two wire limiting structures 220 extend toward each other and are connected to each other, thus improving the limiting effect on the wire 212 and preventing the wire 212 from coming out of the limiting passage 210b.

Although two wire limiting structures 220 are provided on the edge of the seat body 210 in FIG. 5, in other embodiments, it is also possible to provide one or more pairs of wire limiting structures 220 on the edge of the seat body 210 to limit different wires.

Figure 7:
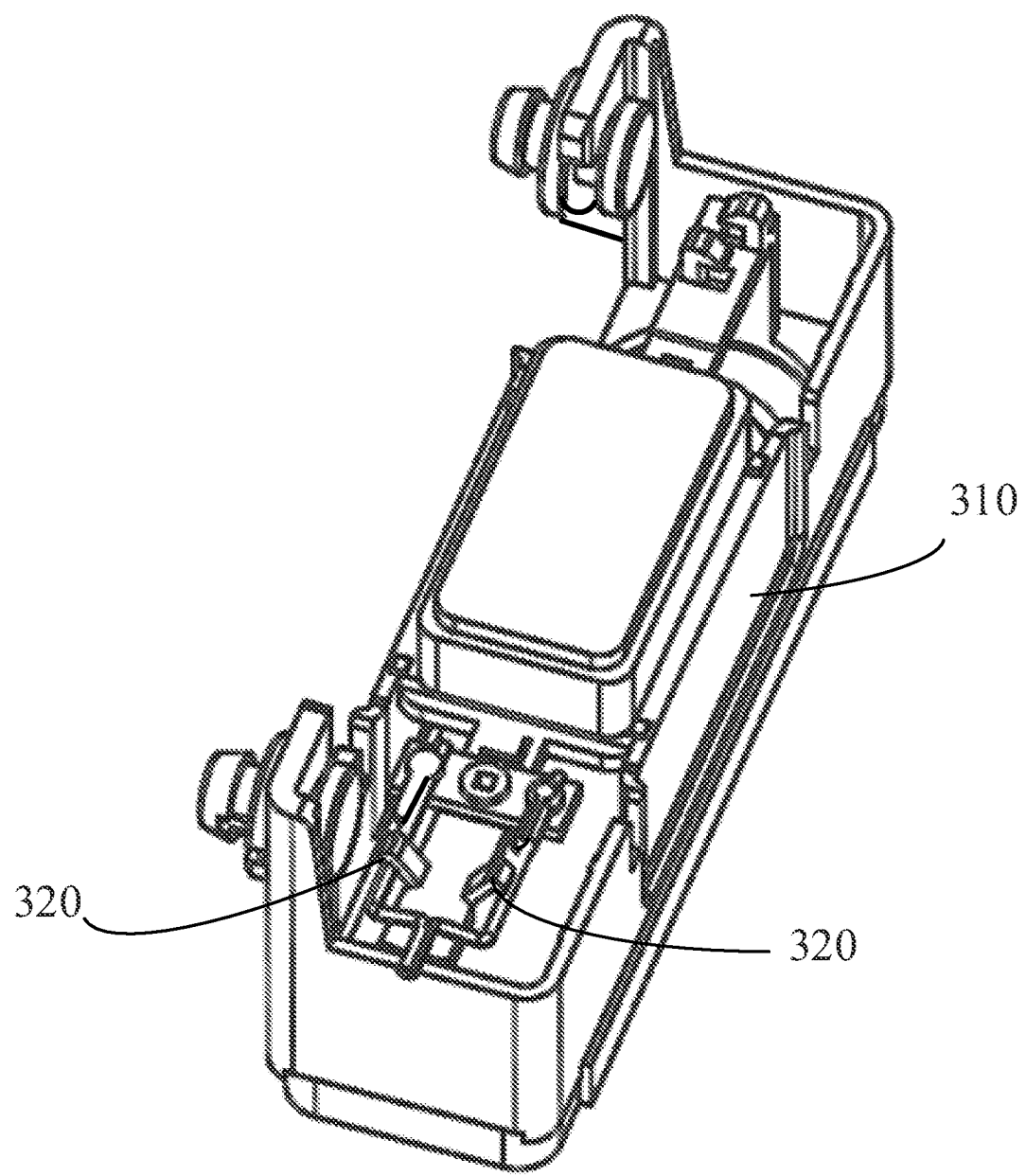
FIG. 7 is a schematic structural diagram of a mounting seat for an electronic device according to an embodiment of the present disclosure.
Figure 8:
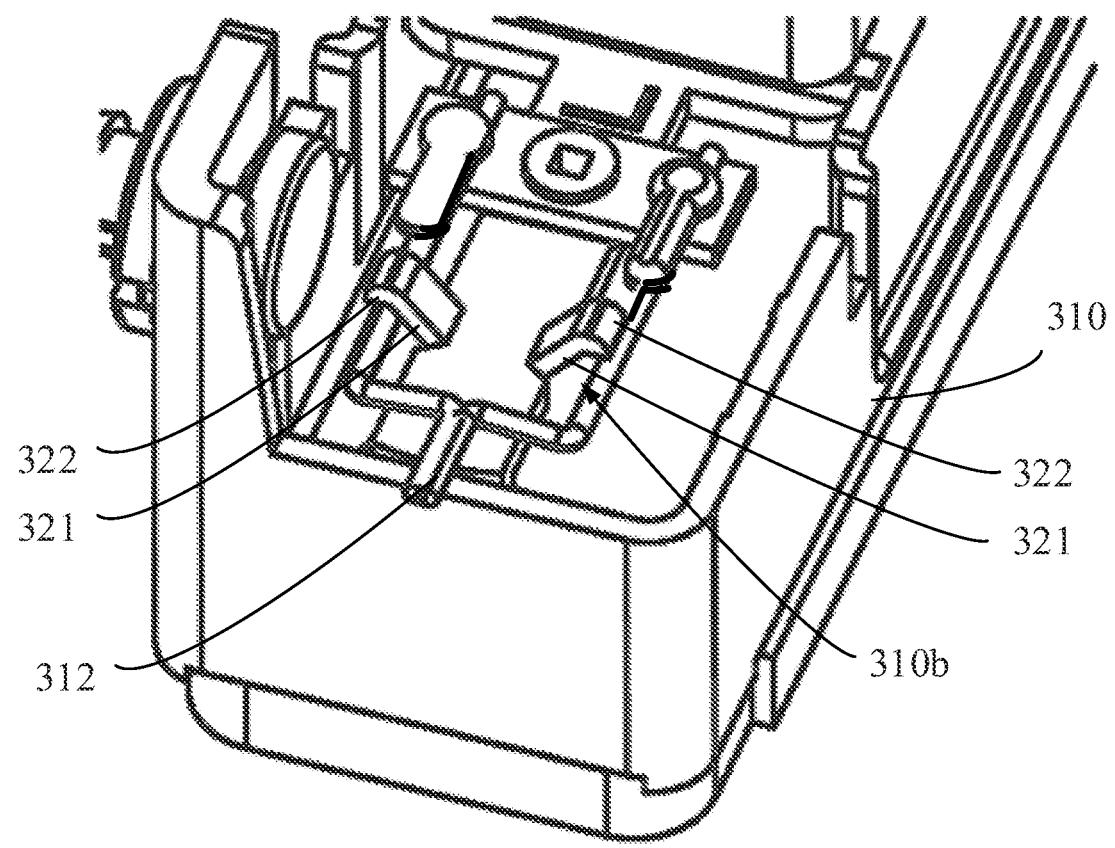
FIG. 8 is a partially enlarged schematic diagram of FIG. 7.

FIG. 7 is a schematic structural diagram of a mounting seat for an electronic device according to an embodiment of the present disclosure. As shown in FIG. 7, a pair of wire limiting structures 320, which is suitable for limiting parallel wires is provided on a seat body 310 of the mounting seat. FIG. 8 is a partially enlarged schematic diagram of FIG. 7. Connection portions 321 are bumps protruded from the surface of the seat body 310, and an extension direction of the bumps may be inclined with respect to the surface of the seat body 310. Two stop portions 322 of this pair of wire limiting structures 320 extend in opposite directions. The limiting passage 310b is provided by the connection portions 321 and the stop portions 322. Wires 312 connected to the electronic device are generally arranged in form of parallel wires, that is, the insulating skins of two wires are connected to each other, and the insulating skins of the two wires need to be torn off for a certain distance when one end of each of the two wires is to be welded to the electronic device. During the limiting of such wires, it is possible to arrange a pair of wire limiting structures 320 between the two wires. Since only one end of each of the two wires is to be torn off, the two wire limiting structures 320 may be supported on the two wires, respectively. When the two wires are bent, the two wires are limited by two stop portions 322 extending in opposite directions and connection portions 321, so that the two wires can be bent only at the stop portions 322.

Figure 9:
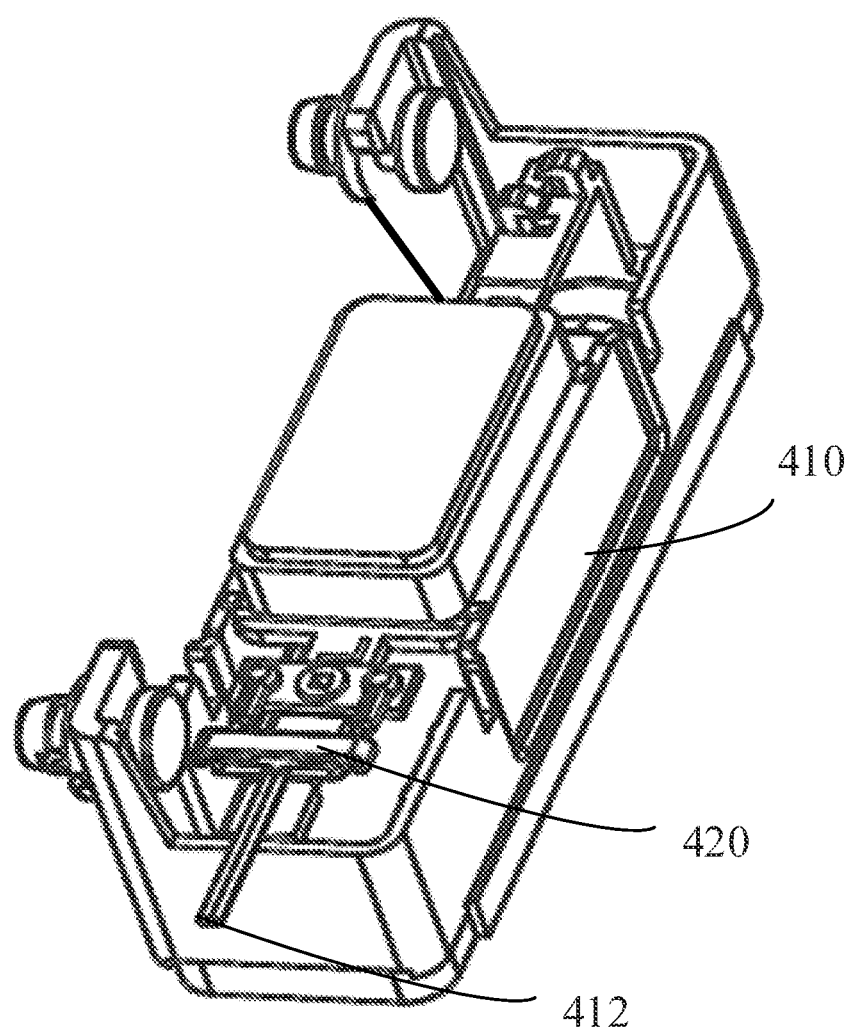
FIG. 9 is a schematic structural diagram of a mounting seat for an electronic device according to an embodiment of the present disclosure.
Figure 10:
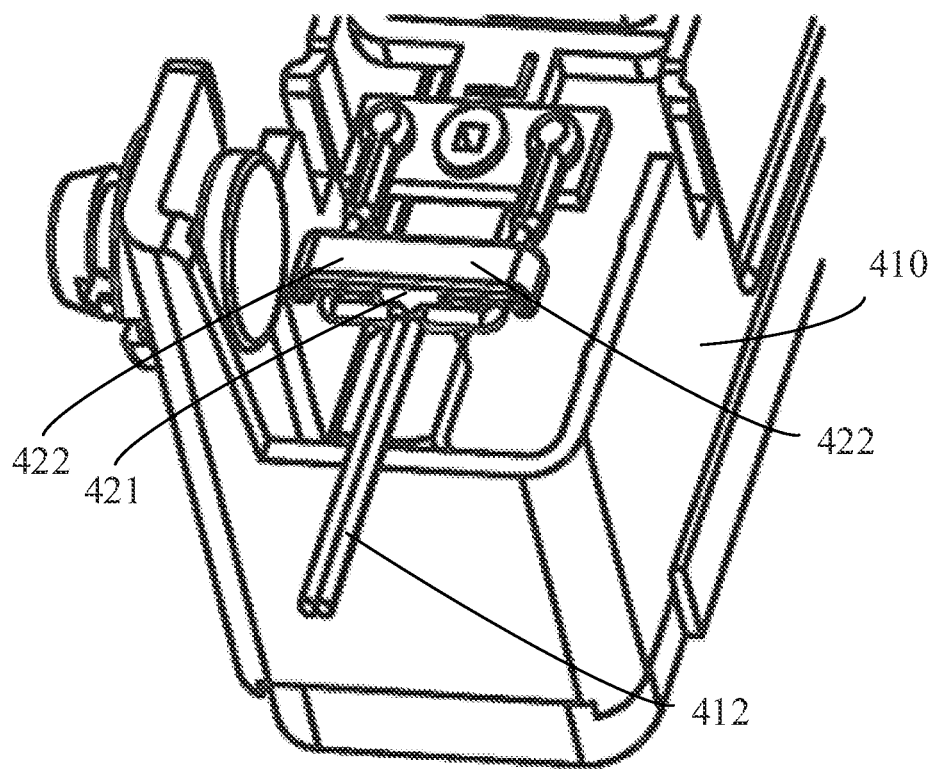
FIG. 10 is a partially enlarged schematic diagram of FIG. 9.

FIG. 9 is a schematic structural diagram of a mounting seat for an electronic device according to an embodiment of the present disclosure. As shown in FIG. 9, a wire limiting structure 420 is provided on a seat body 410 of the mounting seat. FIG. 10 is a partially enlarged schematic diagram of FIG. 9. As shown in FIG. 9 and FIG. 10, the wire limiting structure 420 includes a connection portion 421 and two stop portions 422 which extend from the connection portion 421 in opposite directions. By providing two stop portions 422 on one connection portion 421, it may be convenient to limit two wires or two bundles of wires (e.g., two wires in parallel wires) which are close to each other.

Figure 11:
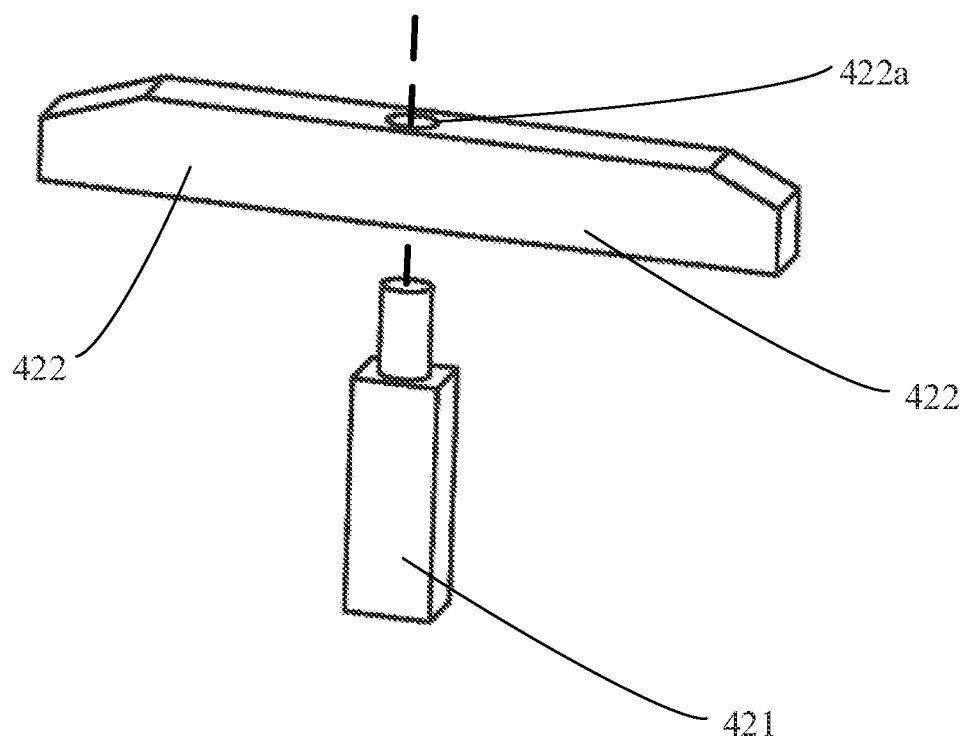
FIG. 11 is a schematic assembly diagram of a stop portion and a connection portion in the mounting seat shown in FIG. 10.

Optionally, the two stop portions 422 and the connection portion 421 may also be connected detachably. FIG. 11 is a schematic assembly diagram of the stop portions and the connection portion in the mounting seat shown in FIG. 10. As shown in FIG. 11, the two stop portions 422 are connected to each other, a connecting hole 422a is formed at a junction of the two stop portions 422, and the two stop portions 422 are clamped onto the connection portion 421 through the connecting hole 422a. During the arrangement of wires, it is possible to remove the two stop portions 422 first, then arrange two wires or two bundles of wires on two sides of the connection portion 421, respectively, and mount the two stop portions 422 onto the connection portion 421. Thus, it is convenient to use.

The connection mode of the stop portions and the connection portion shown in FIG. 11 is merely an example, and other connection modes may also be used in other embodiments to enable the detachable connection between the two stop portions 422 and the connection portion 421. For example, the stop portions 422 and the connection portion 421 may also be detachably connected by screws.

Optionally, the stop portions 422 and the connection portion 421 are connected elastically. By prodding the stop portions 422 to bend the stop portions 422 relative to the connection portion 421, the wires can be easily placed into or taken out from the limiting passages.

Exemplarily, it is possible that the stop portions 422 and the connection portion 421 are connected by elastic rubber, or the stop portions 422 are directly made of elastic rubber, or the wire limiting structure 420 is made of elastic rubber.

In other embodiments, the stop portions 422 and the connection portion 421 may also be provided in a non-detachable integrated structure.

Figure 12:
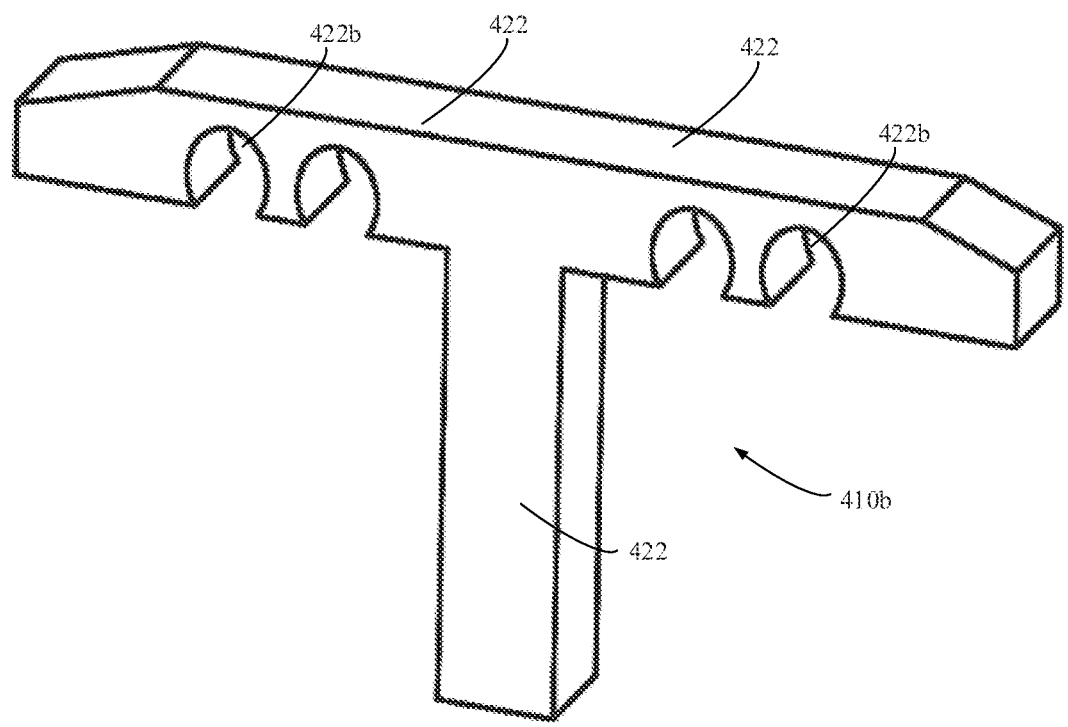
FIG. 12 is a schematic structural diagram of a wire limiting structure according to an embodiment of the present disclosure.

Optionally, for the wire limiting structures shown in FIGS. 1-11, a wire clamping slot may be formed on the stop portion, and an extension direction of the wire clamping slot may be the same as the extension direction of the limiting passage. FIG. 12 is a schematic structural diagram of a wire limiting structure according to an embodiment of the present disclosure. As shown in FIG. 12, based on the wire limiting structure shown in FIG. 11, wire clamping slots 422b are formed on the stop portions 422 of the wire limiting structure. An extension direction of the wire clamping slots 422b is the same as the extension direction of the limiting passages, and the wire clamping slots 422b are formed in the limiting passages. During the limiting of wires within the limiting passages, the wires may be caught by the wire clamping slots 422b, and the limiting effect of the stop portions 422 on the wires may be further improved.

Figure 13:
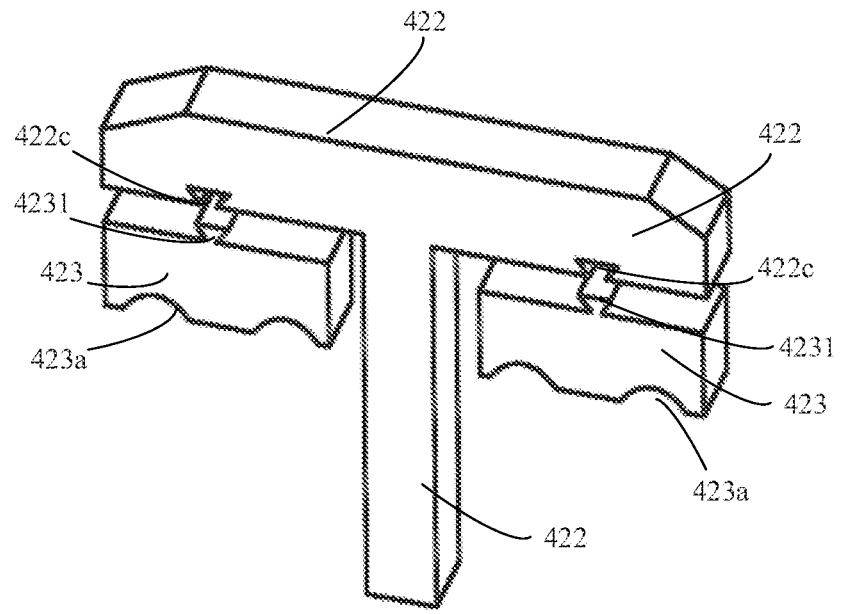
FIG. 13 is a partial schematic structural diagram of a wire limiting structure according to an embodiment of the present disclosure.

Optionally, the wire limiting structure 420 may further include adjustment blocks which are detachably provided between the stop portions 422 and the surface of the seat body 410. FIG. 13 is a partially schematic structural diagram of a wire limiting structure according to an embodiment of the present disclosure. As shown in FIG. 13, adjustment blocks 423 are connected to the stop portions 422 (for convenience of description, the adjustment blocks 423 and the stop portions 422 are separated from each other), and are located within the limiting passages. By providing the adjustment blocks 423, a distance between the stop portions 422 and the surface of the seat body 410 can be changed, so that the diameter of the wires allowed to pass through the limiting passages is changed, and the wire limiting structure can limit the wires having different diameters.

As shown in FIG. 13, strip-shaped ribs 4231 may be provided on the adjustment blocks 423, and strip-shaped slots 422c are correspondingly formed on the stop portions 422. By clamping the strip-shaped ribs 4231 into the strip-shaped slots 422c, the adjustment blocks 423 are mounted on the stop portions 422.

Further, the wire limiting structure 420 may include a plurality of different adjustment blocks 423 for replacement, and each adjustment block 423 may be mounted on the stop portion 422, so that the distance between the adjustment blocks 423 and the surface of the seat body 410 may be changed by replacing different adjustment blocks 423, and the wire limiting structure 420 may limit wires having different diameters.

As shown in FIG. 13, curved groove 423a may also be formed on the adjustment blocks 423. During the limiting of wires, the curved grooves 423a may be fitted onto the wires to further reduce the motion space for the wires and thus improve the limiting effect on the wires.

The number of the curved grooves 423a on the adjustment blocks 422 may be set as required. Meanwhile, different numbers of curved grooves 423a may also be formed on different adjustment blocks 423 in order to satisfy different requirements.

Exemplarily, the adjustment blocks shown in FIG. 13 are additionally provided on the wire limiting structure shown in FIG. 11, in some embodiments, adjustment blocks may also be provided in the embodiments shown in FIGS. 1-8, and the present disclosure is not limited thereto.

Figure 14:
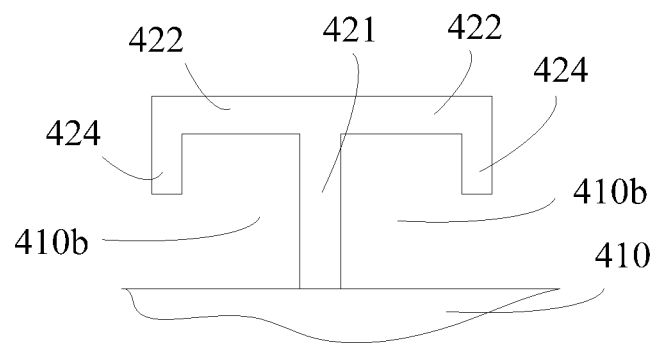
FIG. 14 is a partial schematic structural diagram of a wire limiting structure according to an embodiment of the present disclosure.
Figure 15:
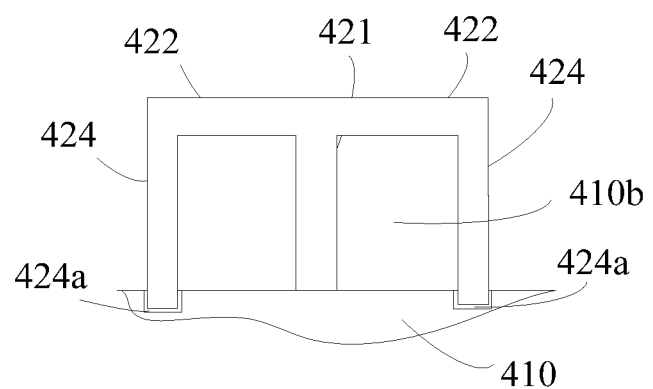
FIG. 15 is a partial schematic structural diagram of a wire limiting structure according to an embodiment of the present disclosure.

Optionally, baffles may be provided on the stop portions, and the baffles and the connection portion are provided on opposite sides of the limiting passage, respectively. The baffles and the connection portion are arranged spaced apart in a direction perpendicular to the extension of the limiting passage. FIGS. 14 and 15 are partially schematic structural diagrams of a wire limiting structure according to an embodiment of the present disclosure. As shown in FIG. 14, edges of the two stop portions 422 are respectively provided with a baffle 424, and the baffles 424 extend in a direction close to the seat body 410. By providing the baffles 424, the wires may be prevented from coming out from the limiting passages 410b, which is advantageous to improve the limiting effect on the wires. Exemplarily, the baffles, shown in FIGS. 14 and 15, are additionally provided on the wire limiting structure shown in FIG. 11, in some embodiments, baffles may also be provided on stop portions in the wire limiting structures shown in FIGS. 1-10, and the present disclosure is not limited thereto.

Further, the baffles 424 may extend to contact with the surface of the seat body 410, thereby further improving the limiting effect of the wire limiting structure on the wires.

Furthermore, baffle clamping structures may be provided at positions on the seat body 410 corresponding to the baffles 424. In this way, after the wires are placed in the limiting passages 410b, the baffles 424 may be connected to the seat body 410 by the baffle clamping structures, so that the wires are limited within the limiting passages 410*b* by the baffles 424, and the wires are prevented from coming out from the limiting passages 410*b*.

As shown in FIG. 15, the baffle clamping structures may be clamping grooves 424*a*. By inserting the baffles 424 into the clamping grooves 424*a*, the baffles 414 are clamped onto the seat body 410. The clamping grooves 424*a* are simple in structure and easy to manufacture.

Optionally, the baffles 424 and the stop portions 422 may be connected elastically or detachably to facilitate placement of the wires in the limiting passages 410*b*. The baffles 424 may also be directly made of elastic material, so that the baffles 424 may be bent and deformed when subjected to an external force (e.g., prodding by a hand), so as to facilitate placing the wires in the limiting passages 410*b*. Meanwhile, the baffles 424 may also be restored to the original shape when the external force is removed, so that the wires are limited within the limiting passages 410*b*. Exemplarily, the elastic material may be rubber.

Figure 16:
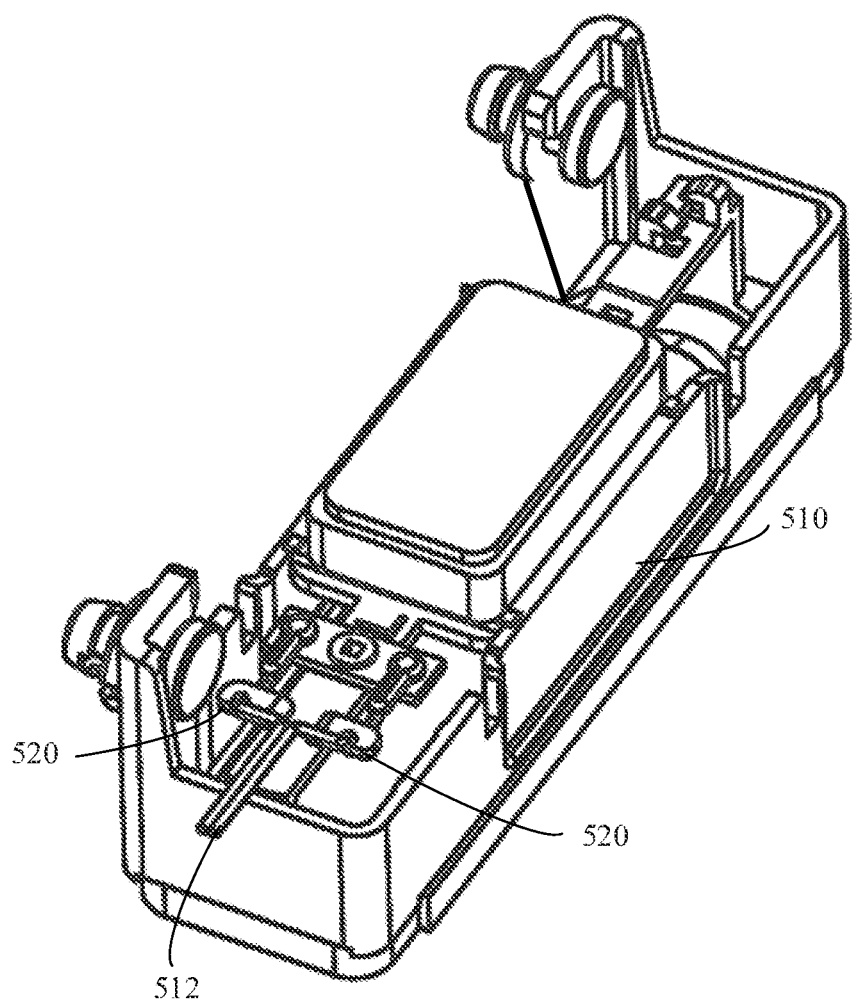
FIG. 16 is a schematic structural diagram of a mounting seat for an electronic device according to an embodiment of the present disclosure.
Figure 17:
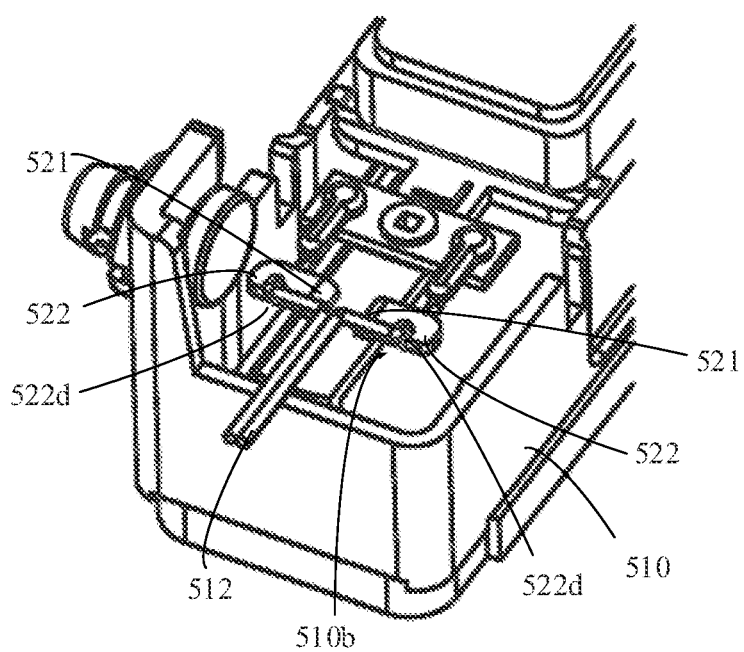
FIG. 17 is a partially enlarged schematic diagram of FIG. 16.

FIG. 16 is a schematic structural diagram of a mounting seat for an electronic device according to an embodiment of the present disclosure. As shown in FIG. 16, a pair of wire limiting structures 520 is provided on a seat body 510 of the mounting seat. Each wire limiting structure 520 in this pair of wire limiting structures 520 includes a clamping plate. FIG. 17 is a partially enlarged schematic diagram of FIG. 16. As shown in FIG. 17, each clamping plate includes a connection portion 521 connected to the seat body 510 and a stop portion 522 for providing a wire clamping slot 522*d*. The wire clamping slot 522*d* extends in a direction perpendicular to an extension direction of the limiting passage 510*b*. A wire 512 may be bent and clamped into the wire clamping slot 522*d* after passing through the limiting passage 510*b*. The wire clamping slot 522*d* may improve the limiting effect on the wire 512.

As shown in FIG. 17, the respective stop portion 522 of the two clamping plates extend in opposite directions. In this way, during the limiting of parallel wires, two wires 512 may be bent and clamped into the wire clamping slots 522*d* after passing through the limiting passages 510*b* and then bent to a clearance between the two clamping plates, and the two wires are combined at the clearance between the two clamping plates.

Figure 19:
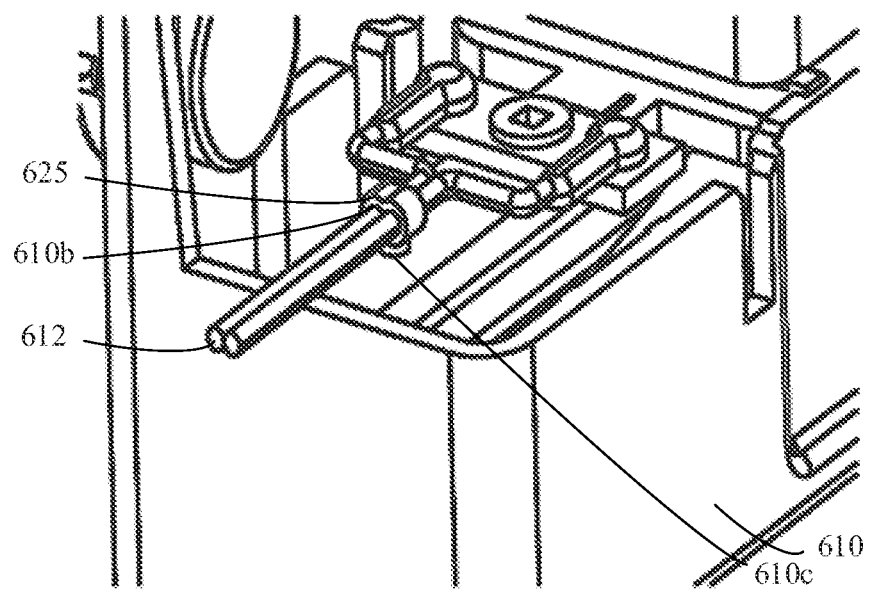
FIG. 19 is a partially enlarged schematic diagram of FIG. 18.

FIG. 18 is a schematic structural diagram of a mounting seat for an electronic device according to an embodiment of the present disclosure. As shown in FIG. 18, a limiting passage 610*b* is provided on the wire limiting structure 620 of the mounting seat. FIG. 19 is a partially enlarged schematic diagram of FIG. 18. As shown in FIG. 19, the limiting passage 610*b* is a wire fixing hole, and the wire limiting structure 620 includes a wire locking bock 625, the wire fixing hole is located on the wire locking bock 625, that is, the limiting passage 610*b* is the wire fixing hole on the wire locking bock 625. The wire fixing hole may better limit and fix the wire 612, so that the possibility of breakage of the wire 612 of the electronic device at a weld position is reduced.

The wire fixing hole may have an inner diameter matched with the outer diameter of the wire. During the arrangement of the wire, the wire may be welded after passing through the wire fixing hole. Exemplarily, the inner diameter of the wire fixing hole may be set to be slightly greater than the outer diameter of the wire, which may facilitate passing the wire through the wire fixing hole.

Figure 20:
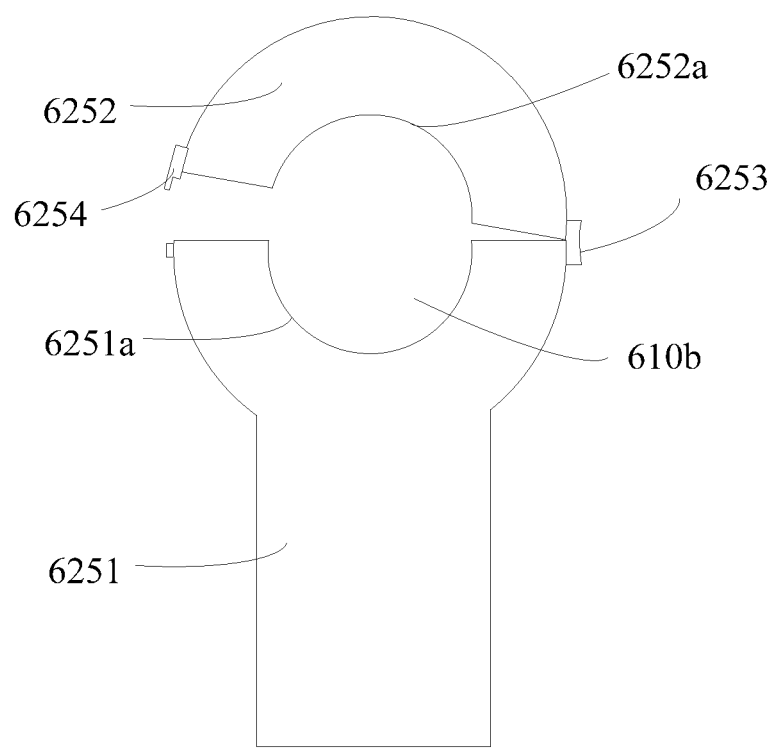
FIG. 20 is a schematic structural diagram of a wire locking block according to an embodiment of the present disclosure.

FIG. 20 is a schematic structural diagram of a wire locking block according to an embodiment of the present disclosure. As shown in FIG. 20, the wire locking block 625 may include a pedestal 6251 and a gland 6252 which are connected detachably, and the limiting passage 610*b* is formed by grooves (e.g., groove 6251*a* and groove 6252*a* shown in FIG. 20) oppositely provided on the pedestal 6251 and the gland 6252, respectively. Thus, the arrangement of the wire 612 may be realized by disassembling or assembling the gland 6252, and it is convenient to use.

Optionally, the pedestal 6251 and the gland 6252 may be connected elastically. As shown in FIG. 20, an elastic connector 6253 is connected between the pedestal 6251 and the gland 6252. When the gland 6252 is prodded by an external force, the elastic connector 6253 may be deformed, so that the gland 6252 is separated from the pedestal 6251. When the external force is removed, the gland 6252 is engaged with the pedestal 6251 again due to the elasticity of the elastic connector 6253.

In some embodiment, the elastic connector 6253 may be adhered to the pedestal 6251 and the gland 6252, or riveted to the pedestal 6251 and the gland 6252 by a rivet.

Optionally, the elastic connector 6253 may be an elastic slice or a rubber slice.

Further, a buckle 6254 may also be connected between the pedestal 6251 and the gland 6252. The buckle 6254 and the elastic connector 6235 are located on two sides of the limiting passage 610*b*, respectively. By providing the buckle 6254, the gland 6252 and the pedestal 6251 may be further locked, thus preventing the wire 612 from being bent by a large external force to separate the gland 6252 from the pedestal 6251.

Figure 21:
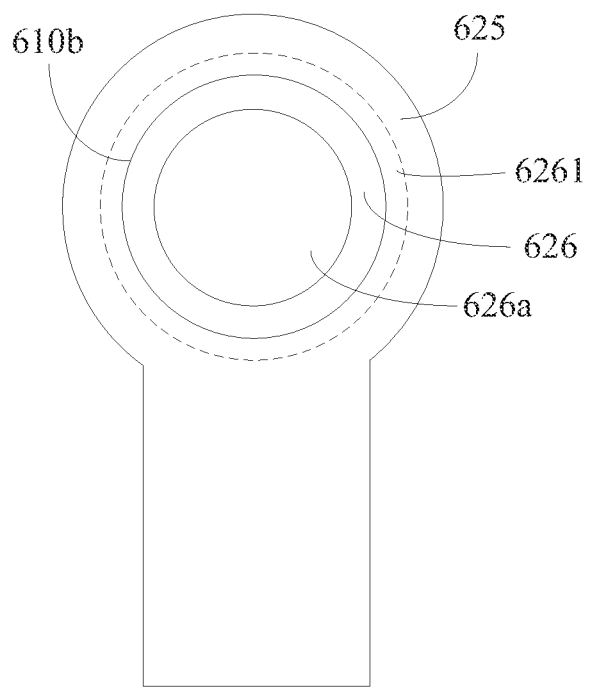
FIG. 21 is a schematic structural diagram of a wire locking block according to an embodiment of the present disclosure.

FIG. 21 is a schematic structural diagram of a wire locking block according to an embodiment of the present disclosure. As shown in FIG. 21, a wire bundling block 626 is detachably located in the wire fixing hole, and a wire bundling hole 626*a* for fixing the wire is provided on the wire bundling block 626. By providing the wire bundling block 626, the wire locking block 625 can limit wires having different diameters. Or, when the wire bundling block 626 is disassembled, a bundle of wires are limited at the same time by the wire fixing hole; and after the wire bundling block 626 is assembled, a wire is limited.

Figure 22:
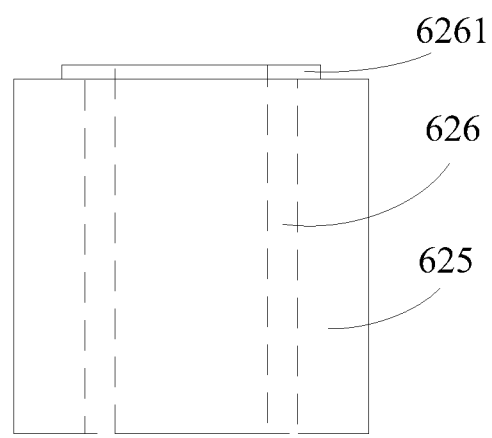
FIG. 22 is a schematic structural diagram of a wire locking block according to an embodiment of the present disclosure.

FIG. 22 is a schematic structural diagram of a wire locking block according to an embodiment of the present disclosure. As shown in FIG. 22, the wire bundling block 626 may be cylindrical. A stop collar 6261 radially extending outward may be provided at one end of the wire bundling block 626. The stop collar 6261 has an outer diameter greater than the inner diameter of the wire fixing hole. In this way, the wire bundling block 626 may be limited by the stop collar 6261 when the wire bundling block 626 is mounted in the wire fixing hole.

Optionally, the wire limiting structure shown in FIG. 21 and FIG. 22 may include a plurality of replaceable wire bundling blocks 626 which are the same in the outer diameter but different in the inner diameter. Thus, by replacing different wire bundling blocks 626, the wire limiting structure can limit a plurality of wires having different diameters.

Optionally, for any one of the mounting seats shown in FIGS. 1-22, the wire limiting structure and the seat body may be connected detachably. In this way, it may be convenient to disassemble or assemble the wire limiting structure, and the seat body of the mounting seat for the electronic device is usually processed by a mold. Since the wire limiting structure and the seat body are connected detachably, the mold can be simplified, the design cost for the mold can be reduced, and the processing of the seat body is facilitated. Optionally, the wire limiting structure and the seat body may be provided as a non-detachable integrated structure, and the present disclosure is not limited thereto.

Taking the embodiment shown in FIG. 19 as example, a mounting hole 610c may be provided on the seat body 610, and the pedestal 6251 may be inserted into the mounting hole 610c.

Optionally, the wire limiting structures of different structures and the seat body may be connected by the same connection structure. For example, the connection may be realized by mounting holes in the seat body, and the diameter of each mounting hole may be the same, so that it is possible to replace wire limiting structures in different forms on the seat body, and it is convenient to use. In addition, it is also possible to form a plurality of mounting holes in the seat body, so as to select, according to different requirements, different numbers of mounting holes at different positions for purpose of mounting the wire limiting structures.

Optionally, it is also possible to provide insertion slots or connection structures in other forms on the seat body in order to mount the wire limiting structures on the seat body. For example, it is also possible to mount the wire limiting structures on the seat body by screws or to adhere the wire limiting structures to the seat body by an adhesive.

Optionally, it is possible to provide only one wire limiting structure on the seat body of the same mounting seat, or it is also possible to provide a plurality of wire limiting structures of different structures (for example, two wire limiting structures are provided on the seat body in FIG. 7, 9, 16 or 18), so as to meet different requirements and improve the limiting effect on the wire.

An embodiment of the present disclosure further provides an electronic apparatus. The electronic apparatus includes a mounting seat, an electronic device and a wire welded to the electronic device. Here, the mounting seat is any one of the mounting seats in the embodiments shown in FIGS. 1-22. The electronic device is mounted on the seat body, and the wire is mounted on the wire limiting structure in a limited manner.

For example, the electronic apparatus may be a loudspeaker, a microphone, an electric motor or the like.

After the wire is welded to the electronic device, the wire will often be bent repeatedly in the subsequent technological process or use process, so that the wire is easy to break at a weld position. In the embodiments of the present disclosure, by providing the wire limiting structure on the seat body, the wire connected to the electronic device can be limited. When the wire is bent due to an external force, by virtue of the wire limiting structure, the wire will be bent at the wire limiting structure rather than at the weld position, so that the disconnection of the wire from the electronic device at a junction can be avoided.

The foregoing descriptions are merely exemplary embodiments of the present disclosure, and are not intended to limit the present disclosure. Within the spirit and principles of the disclosure, any modifications, equivalent substitutions, improvements, etc., are within the protection scope of the appended claims of the present disclosure.

What is claimed is:

1. A mounting seat for an electronic device, comprising a seat body and at least one pair of wire limiting structures, a mounting region for mounting a wire weld portion of the electronic device is on the seat body, the at least one pair of wire limiting structures are on the seat body near the mounting region, and a limiting passage is on the mounting seat, wherein the limiting passage is between the at least one pair of wire limiting structures and the seat body, wherein a wire bundle is limited in the limiting passage, wherein two wire limiting structures in each pair of the wire limiting structures are arranged on two sides of the wire bundle which comprises two wires that are adjacent and arranged in parallel;

each wire limiting structure among the at least one pair of wire limiting structures comprises a connection portion and a stop portion, the connection portion is connected between the seat body and the stop portion, and the limiting passage is between the stop portion and the seat body, and the two wire limiting structures in each pair of wire limiting structures are spaced apart in extension direction of the wire, so that the two wire limiting structures in each pair of wire limiting structures are not aligned in a direction perpendicular to the extension direction of the wire, the at least one pair of wire limiting structures are detachably connected to the seat body.

2. The mounting seat according to claim 1, wherein each wire limiting structure among the at least one pair of wire limiting structures further comprises adjustment blocks which are detachably between the stop portions and the surface of the seat body.

3. The mounting seat according to claim 1, wherein the connection portion and the stop portion are connected elastically or detachably.

4. An electronic apparatus, comprising a mounting seat, an electronic device and a wire welded to the electronic device, the mounting seat comprising a seat body and at least one pair of wire limiting structures, a mounting region for mounting a wire weld portion of the electronic device is on the seat body, the at least one pair of wire limiting structures are on the seat body near the mounting region; the electronic device is mounted on the seat body, the wire is mounted on the at least one pair of wire limiting structures in a limited manner; a limiting passage is on the mounting seat, wherein the limiting passage is between the at least one pair of wire limiting structures and the seat body, wherein a wire bundle is limited in the limiting passage, wherein two wire limiting structures in each pair of the wire limiting structures are arranged on two sides of the wire bundle which comprises two wires that are adjacent and arranged in parallel;

each wire limiting structure among the at least one pair of wire limiting structures comprises a connection portion and a stop portion, the connection portion is connected between the seat body and the stop portion, and the limiting passage is between the stop portion and the seat body, and the two wire limiting structures in each pair of wire limiting structures are spaced apart in extension direction of the wire, so that the two wire limiting structures in each pair of wire limiting structures are not aligned in a direction perpendicular to the extension direction of the wire, the at least one pair of wire limiting structures are detachably connected to the seat body.

* * * * *